US009763338B2

(12) United States Patent
Hacking

(10) Patent No.: US 9,763,338 B2
(45) Date of Patent: Sep. 12, 2017

(54) MODULAR CASINGS

(71) Applicant: Modaptix Limited, Cambridgeshire (GB)

(72) Inventor: Maximillian Arthur David Hacking, Cambridgeshire (GB)

(73) Assignee: Modaptix Limited, Cambridgeshire (GB)

( * ) Notice: Subject to any disclaimer, the term of this patent is extended or adjusted under 35 U.S.C. 154(b) by 0 days.

(21) Appl. No.: 14/911,603

(22) PCT Filed: Aug. 11, 2014

(86) PCT No.: PCT/GB2014/052448
§ 371 (c)(1),
(2) Date: Feb. 11, 2016

(87) PCT Pub. No.: WO2015/022508
PCT Pub. Date: Feb. 19, 2015

(65) Prior Publication Data
US 2016/0192509 A1      Jun. 30, 2016

(30) Foreign Application Priority Data

Aug. 12, 2013   (GB) .................................. 1314399.5

(51) Int. Cl.
*H05K 5/00* (2006.01)
*G06F 1/18* (2006.01)
*B33Y 50/02* (2015.01)

(52) U.S. Cl.
CPC ........... *H05K 5/0004* (2013.01); *G06F 1/181* (2013.01); *G06F 1/183* (2013.01); *H05K 5/0021* (2013.01);
(Continued)

(58) Field of Classification Search
CPC .......... H02G 3/08; H02G 3/081; H02G 3/086; H05K 5/00; H05K 5/02; H05K 5/0247;
(Continued)

(56) References Cited

U.S. PATENT DOCUMENTS 3,767,237 A    10/1973   Suchowski
3,866,381 A     2/1975   Eschbach et al.
(Continued)

FOREIGN PATENT DOCUMENTS

CH        682252 A5    8/1993
CN     101370364 A     2/2009
(Continued)

OTHER PUBLICATIONS

Espacenet, English Machine Translation of Abstract for FR2265302A1, published Oct. 24, 1975, retrieved from http://worldwide.espacenet.com on Jan. 22, 2016 (1 page).
(Continued)

*Primary Examiner* — Angel R Estrada
(74) *Attorney, Agent, or Firm* — Wood Herron & Evans LLP

(57) ABSTRACT

A modular casing for electronic equipment comprises edge portions and corner portions. Each corner portion is interlocked with adjacent edge portions to form a framework. The casing also includes panels which are retained in the casing by engagement with edge portions. The dimensions of the casing can be selected to suit particular requirements by varying the length of the edge portions or the number of edge portions along each edge of the casing.

13 Claims, 22 Drawing Sheets

(52) U.S. Cl.
CPC ....... *B33Y 50/02* (2014.12); *G06F 2200/1635* (2013.01)

(58) Field of Classification Search
CPC H05K 7/00; H05K 7/02; H05K 7/186; H05K 7/18; H05K 7/183; H05K 5/0004; H05K 5/0021; H02B 1/01; H02B 1/14; H02B 1/26; H02B 1/30; G06F 1/181; G06F 1/183; G06F 2200/1635; B33Y 50/02
USPC ......... 174/50, 520, 17 R, 559, 560; 361/600, 361/601, 729, 730, 679.01; 312/223.1, 312/223.2, 223.6
See application file for complete search history.

(56) References Cited

U.S. PATENT DOCUMENTS

| | | | | |
|---|---|---|---|---|
| 4,544,069 | A | | 10/1985 | Cavallini |
| 4,653,783 | A | | 3/1987 | Steup |
| 4,691,970 | A | | 9/1987 | Neri |
| 5,231,247 | A | * | 7/1993 | Paul ................. H02B 13/02 174/50 |
| 6,359,217 | B1 | * | 3/2002 | Thompson ........... H05K 5/0247 174/50 |
| 8,152,403 | B2 | * | 4/2012 | Shen ................. H02B 1/01 312/265.1 |
| 8,403,431 | B2 | * | 3/2013 | Elkins ............... H05K 7/186 312/265.1 |
| 8,599,540 | B2 | * | 12/2013 | Fernandez ........... H05K 7/186 174/50 |
| 9,549,482 | B2 | * | 1/2017 | Podemski ............ H05K 7/02 |
| 2003/0193274 | A1 | | 10/2003 | Saravis |
| 2005/0174723 | A1 | | 8/2005 | Chan et al. |
| 2006/0248837 | A1 | | 11/2006 | Appleford |
| 2008/0302027 | A1 | | 12/2008 | Appleford |
| 2010/0053926 | A1 | | 3/2010 | Shi et al. |
| 2012/0146893 | A1 | | 6/2012 | Maas et al. |

FOREIGN PATENT DOCUMENTS

| | | |
|---|---|---|
| DE | 29912174 U1 | 10/1999 |
| EP | 0720265 A1 | 7/1996 |
| EP | 1437929 A2 | 7/2004 |
| FR | 2265302 A1 | 10/1975 |
| FR | 2493663 A1 | 5/1982 |
| FR | 2770045 A1 | 4/1999 |
| GB | 1516246 A | 6/1978 |
| GB | 2069767 A | 8/1981 |
| GB | 2129903 A | 5/1984 |
| WO | 03001637 A1 | 1/2003 |
| WO | 2013143202 A1 | 10/2013 |

OTHER PUBLICATIONS

Espacenet, English Machine Translation of Abstract for FR2493663A1, published May 7, 1982, retrieved from http://worldwide.espacenet.com on Jan. 21, 2016 (1 page).

Espacenet, English Machine Translation of Abstract for CH682252A5, published Aug. 13, 1993, retrieved from http://worldwide.espacenet.com on Jan. 22, 2016 (1 page).

Espacenet, English Machine Translation of Abstract for EP0720265A1, published Jul. 3, 1996, retrieved from http://worldwide.espacenet.com on Jan. 22, 2016 (2 pages).

Espacenet, English Machine Translation of Abstract for FR2770045A1, published Apr. 23, 1999, retrieved from http://worldwide.espacenet.com on Jan. 21, 2016 (2 pages).

Espacenet, English Machine Translation of Abstract for EP1437929A2, published Jul. 14, 20014, retrieved from http://worldwide.espacenet.com on Jan. 22, 2016 (1 page).

Espacenet, English Machine Translation of Abstract for CN101370364A, published Feb. 18, 2009, retrieved from http://worldwide.espacenet.com on Jan. 21, 2016 (1 page).

Intellectual Property Office of the United Kingdom, Patents Act 1977: Search Report under Section 17, Application No. GB1314399.5, dated Sep. 23, 2013 (2 pages).

Intellectual Property Office of the United Kingdom, Patents Act 1977: Further Search Report under Section 17, Application No. GB1314399.5, dated Jan. 3, 2014 (2 pages).

European Patent Office, International Search Report and Written Opinion of the International Searching Authority, International Application No. PCT/GB2014/052448, dated Feb. 2, 2015 (19 pages).

* cited by examiner

MODULAR CASINGS

CROSS-REFERENCE TO RELATED APPLICATIONS

This application is a submission under 35 U.S.C. §371 of International Application No. PCT/GB2014/052448, filed Aug. 11, 2014, which claims priority to Great Britain Application No. 1314399.5, filed Aug. 12, 2013, the disclosures of which are hereby expressly incorporated by reference herein in their entireties.

FIELD OF THE INVENTION

The present invention relates to casings for electronic equipment and, more particularly, to casings of this type which have a modular configuration.

BACKGROUND OF THE INVENTION

Casings for electronic devices protect the electronic components and improve the durability of the devices. They may also be used to support input and output connectors and other interfaces such as displays. Recently, relatively inexpensive "single-board computers" (SBCs) have become available. To optimise their versatility and minimise cost, they tend to be sold without a casing, which then has to be obtained separately.

SUMMARY OF THE INVENTION

The present invention provides a modular casing comprising edge portions and corner portions, with each corner portion interlocked with adjacent edge portions to form a framework, and panels which are retained by engagement with edge portions.

The dimensions of this casing configuration can be selected to suit particular requirements by varying the length of the edge portions and/or the number of edge portions along each edge of the casing. It is therefore expandable to suit particular needs. Furthermore, it can provide a rigid, robust protective casing.

The framework of the casing supports the panels that form side walls of the casing. At least one side wall of the casing may comprise a plurality of panels which are retained in the casing by engagement with each other and surrounding edge portions. This modular panel construction enables the panels to form a side wall of the required size for the framework.

Preferably, at least one panel has a projection extending from an edge and an adjacent panel has a cavity defined in one edge, such that the at least one panel is interengaged with the adjacent panel by insertion of the projection into the cavity. This arrangement prevents a panel from moving sideways relative to an adjacent panel.

In a preferred arrangement, each edge of at least one panel has a projection extending from it and a cavity defined in it for interengagement with an adjacent panel. In this way, each panel has a reciprocal interconnection with an adjacent panel facilitating a modular panel construction. In particular, the arrangement of projections and cavities around the edges of the at least one panel may be rotationally symmetrical. This increases the versatility of the modular layout.

At least one of the edge portions may be arranged to receive a projection on an adjacent panel. In this way, the edge portion is able to retain the panel within the casing.

Preferably, a slot may be defined in at least one edge portion for sliding engagement with a projection on an adjacent panel. Thus, during construction of a modular casing embodying the present invention, a casing side wall formed of one or more panels may be slid into place between two edge portions.

The modular casing may include edge portions of different lengths. Edges of the casing may include more than one edge portion to achieve a required edge length. In some embodiments, the framework may include at least two mutually interlocked edge portions. The edge portions may be interconnected end-to-end. In order to provide this interlocking, one edge portion may include a lug and the other edge portion include a detent which engages with the lug when the two portions are pushed together. The lug and/or detent, or the mounting of the lug and/or detent may be resilient such that, as the lug moves past the detent, it snaps into its engaged position, so that it is clear to the user that the required interlock has been achieved.

Preferably, the other portion includes a lug and the one edge portion includes a detent which engages with the lug when the two portions are pushed together. This reciprocal form of interlocking provides more secure engagement between the two edge portions.

One edge portion may include a tab projection from one end which is received in a corresponding hole in one end of another edge portion. This serves to resist rotation of one edge portion relative to the other. Preferably, this tab and hole configuration is provided in combination with one or more lug and detent combinations to provide a more secure interconnection. In the embodiments, the tab may be curved in transverse cross-section. This cross-section may be substantially in the form of a quarter circle, for example.

An edge portion may be configured to engage with two, three or four mutually orthogonal panels, increasing the variety of casing configurations that can be achieved.

A corner portion may be configured to be interlocked with three, four, five or six mutually orthogonal edge portions. In other embodiments, other angles may be defined between the edge portions when they are interlocked with a corner portion.

Preferably, each corner portion is interengaged with each edge portion by lugs and complementary detents on the corner portion and edge portions.

At least one corner portion may define a slot adjacent to a detent, such that a lug engaged with the detent may be disengaged from the detent by a user accessing the detent from outside the casing via the slot. Such a slot may be defined by at least one or each of the corner portions around the base of the casing, but not on other corner portions. In this way, the casing may be configured such that the slots are not visible when it is resting on its base.

Each corner portion may be interengaged with adjacent edge portions by tabs and complementary holes on the corner portion and edge portions. This configuration serves to restrict sideways movement of the edge portions relative to the corner portions.

Preferably, each lug is resiliently coupled to the edge portion or corner portion of which it forms part. This facilitates displacement of the lug as it moves over a corresponding detent.

Each lug may be integrally formed with the respective edge portion or corner portion for ease of manufacture.

Alternatively, or in addition, each detent may be resiliently coupled to the edge portion or corner portion of which it forms part. Each detent may be integrally formed with the respective edge portion or corner portion, for ease of manufacture.

In order to minimise the number of different parts required to form a casing, in preferred embodiments, the corner portions around one side wall of a casing are substantially identical. Similarly, each of the edge portions may be substantially identical, and configured such that each end is able to interconnect with either an adjacent edge portion or corner portion.

The present invention further provides a kit of parts for forming a modular casing comprising edge portions and corner portions, with each corner portion configured to interlock with edge portions to form a framework, and panels which are configured so as to be retained by engagement with edge portions.

Casings embodying the present invention are particularly suitable for housing electronic or electrical equipment. The casing panels may be adapted to incorporate a range of interfaces and/or interconnections with the internal components.

BRIEF DESCRIPTION OF THE DRAWINGS

Embodiments of the present invention will now be described by way of example and with reference to the accompanying schematic drawings, wherein.

DETAILED DESCRIPTION OF THE INVENTION

Figure 1:
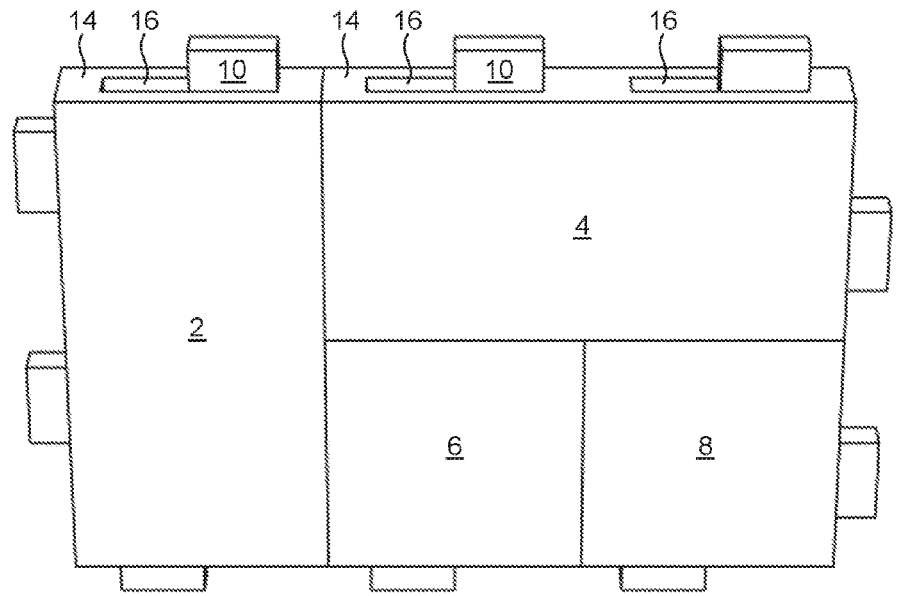
FIG. 1 is a perspective view of four interlocked casing panels.

FIG. 1 illustrates four interlocking casing panels 2, 4, 6 and 8 according to an embodiment of the present invention. Rectangular pieces 2 and 4 are topologically identical, as are the square pieces 6 and 8. At least one projection 10 extends from each edge 14 of each panel. A cavity or slot 16 having dimensions complementary to those of the projections are also defined in each edge of each panel, alongside each projection.

It can be seen that the four panels 2, 4, 6 and 8 are therefore interengaged by insertion of projections into corresponding cavities defined by adjacent panels.

Each panel (including its projections and cavities) is rotationally symmetrical. Thus, the shape of the rectangular pieces is the same if they are rotated through 180°, whilst the shape of the square pieces remains the same if they are rotated through multiples of 90°.

One side of a square panel 6, 8 represents a unit length that includes one projection and one cavity and forms the basis for a modular panel system. This configuration is repeated with the same dimensions on each side of the square. It is also repeated on each side of the rectangular pieces 2 and 4. Each shorter side of each rectangular piece corresponds to the unit length, and each longer side corresponds to two unit lengths. Each longer side replicates the configuration of a side of unit length twice, and therefore has two projections, each with a cavity alongside. The relative positions and spacings of projections and cavities along each unit length of the sides of each piece remains constant for each panel shape after rotation through any multiple of 90°. It will be appreciated that this modular approach means that any panel shapes based on multiples of squares of the unit length which replicate the configuration of projections and cavities will be able to interengage with other panels following the same pattern.

Each side of each square panel may be around 30 mm long, for example, with each projection 10 extending around 5 mm beyond the respective edges of the associated panel.

Figure 2A:
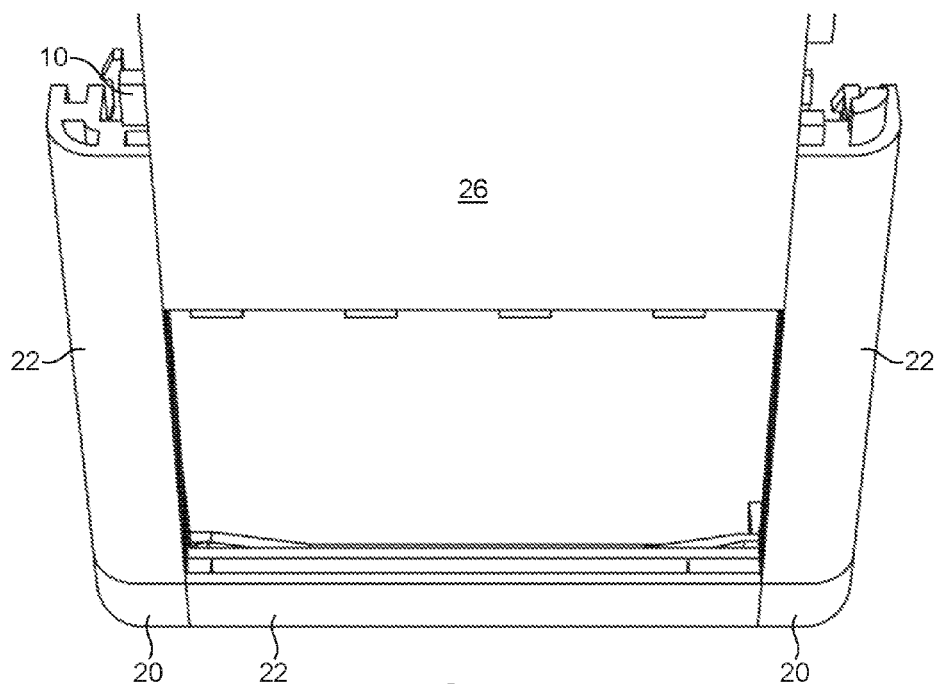
FIGS. 2A and 2B are perspective views of two casing corners interlocked with three casing edges and a panel partially inserted between them.
Figure 2B:
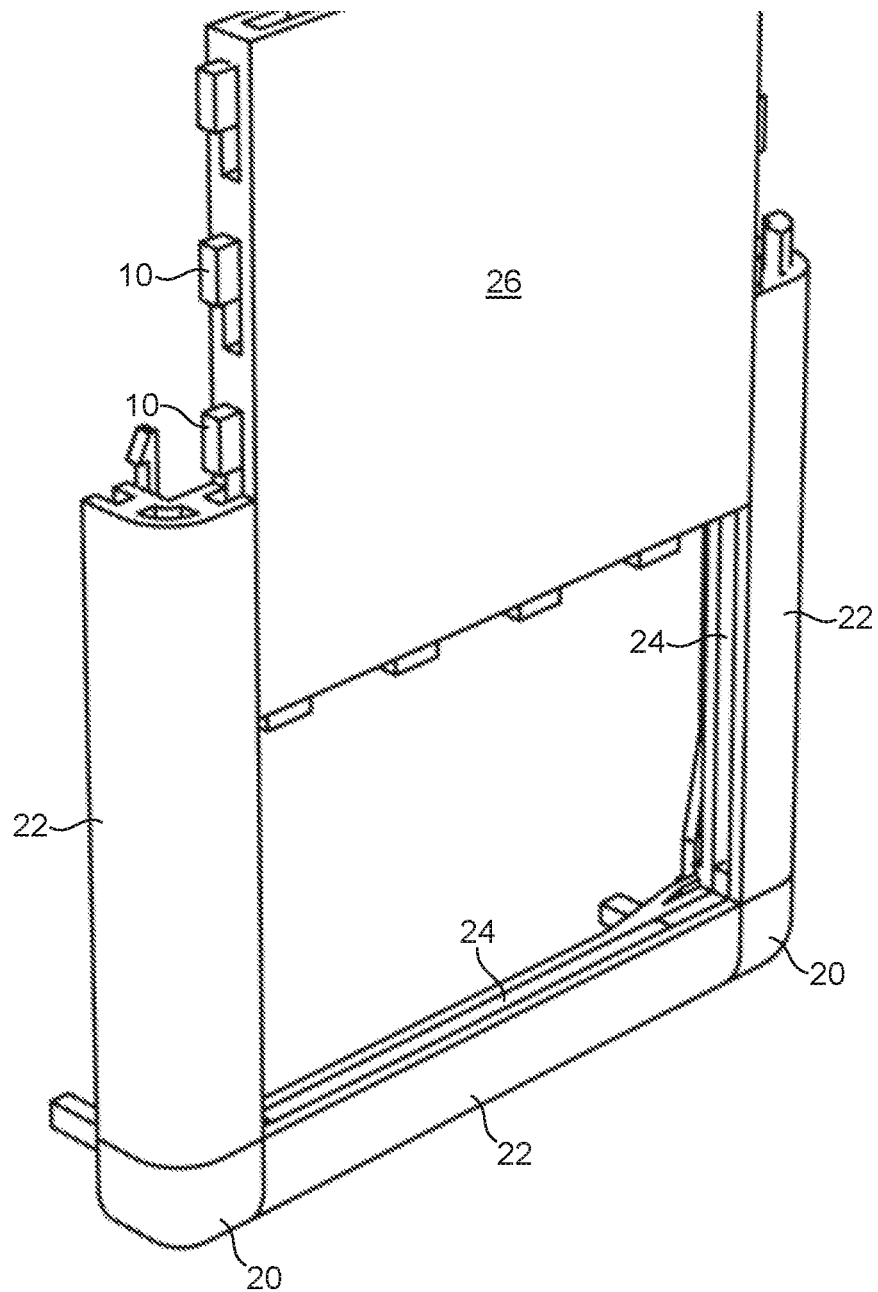

FIGS. 2A and 2B illustrate a casing panel in combination with edge portions and corner portions of a casing embodying the present invention. A corner portion 20 is mounted at either end of an edge portion 22 whilst a further two edge portions are coupled to respective corner portions, at right angles to the original edge portion.

Longitudinally extending slots or grooves 24 are defined by an inwardly facing surface of each edge portion. The width of the slots matches that of the projections on a panel 26, enabling the panel to slide into position between the two parallel edge portions. It will be appreciated that panel 26 may be a single panel, or multiple panels joined together in the manner shown in FIG. 1.

The panel is then held firmly in place within the framework formed by the edge portions and corner portions by the interaction of its projections with the slots or grooves 24 defined in adjacent edge portions.

Figure 3:
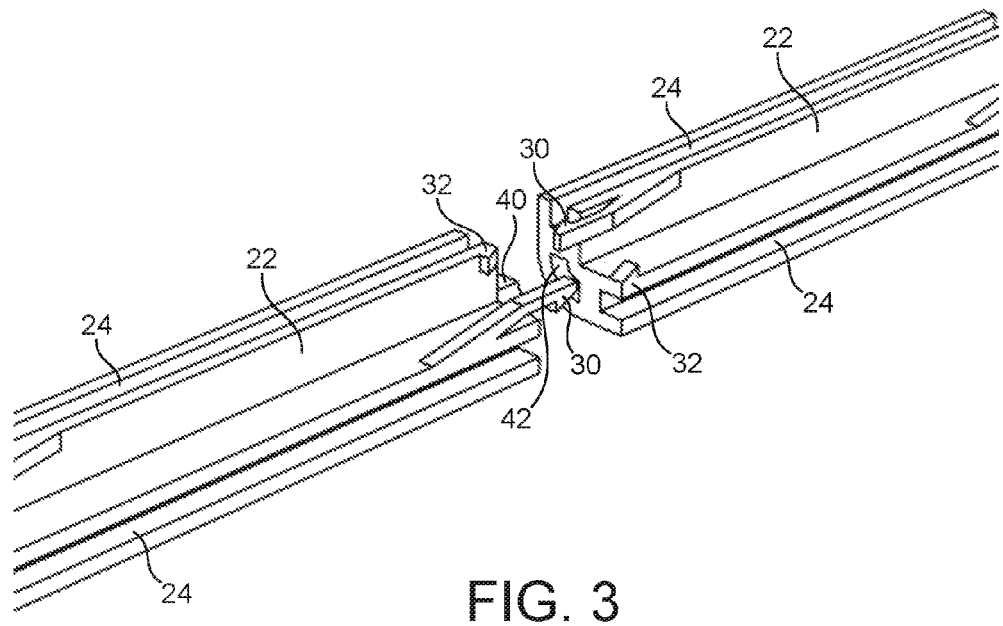
FIG. 3 is a perspective view of part of two edge portions.
Figure 4:
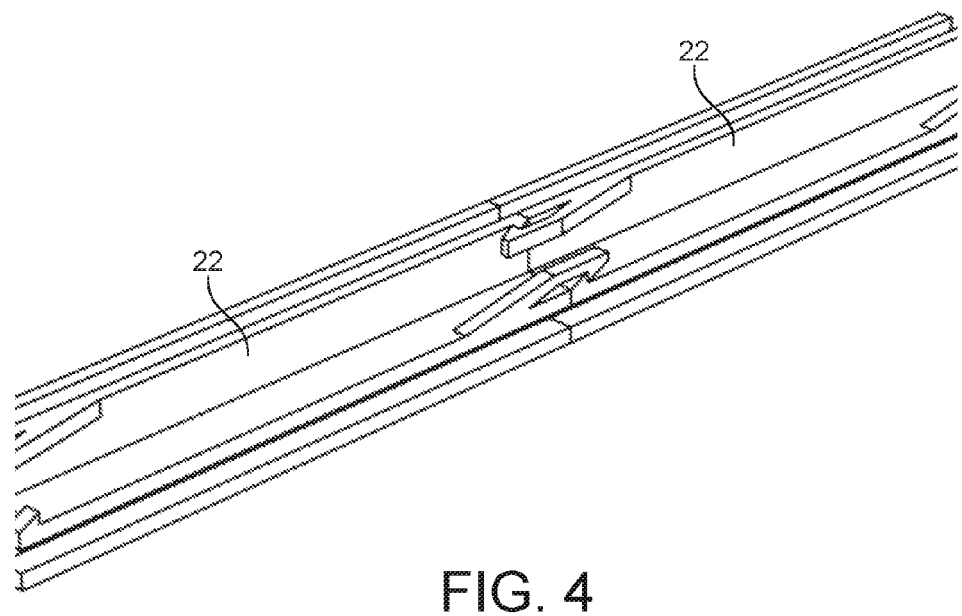
FIG. 4 shows the edge portions of FIG. 3 once they have been mutually interlocked.

The configuration of the edge portions enables them to be connected to each other end-to-end and/or to corner portions. This enables edge portions (of the same or differing lengths) to be combined to achieve a desired total edge length. The interlocking of two edge portions end-to-end according to a preferred embodiment is illustrated in FIGS. 3 and 4.

A projection or lug 30 and a detent 32 is provided at each end of each edge portion. They are configured such that as the edge portions are pushed together, each lug comes into contact with, passes over and then interlocks with a corresponding detent. The faces which engage initially on the projections and detents are inclined relative to the longitudinal axes of the edge portions to assist the movement of the lugs over the detents.

The lugs are integrally formed in the respective edge portions. The material of the edge portions and the dimensions of the lugs are selected to give some resilience to the lugs. Thus, each lug flexes as it passes over the corresponding detent and then snaps into its locked configuration once the tapered portion of the lug has passed over the detent. This gives a clear indication to the user when the lugs and detents have successfully interlocked.

A tab 40 extends from one end of each edge portion and a corresponding hole 42 is defined in the other end of each edge portion. The tab and hole serve to locate one edge portion relative to the other as they are pushed together during the interlocking process. Furthermore, they inhibit rotation of one edge portion relative to the other once the edge portions have been locked together. The tab and hole may define a quarter annulus in cross-section in a transverse plane with respect to the longitudinal axis of each edge portion.

The positions of the lugs and detents in the locked configuration is shown in FIG. 4.

Interlocking of edge portions with corner portions will now be described in more detail with reference to FIGS. 5 to 8.

Each corner portion is configured to interlock with three mutually orthogonal edge portions having the configuration described above. The corner portion 20 defines three detents 34 for interlocking with the lugs 30 of the edge portions. Also, the corner portion shown in FIG. 5 has two tabs 36 for insertion into the holes 42 of two of the edge portions. It also defines a hole 44 for receiving a tab 40 of the third edge portion.

In addition, to provide further rigidity, the corner portion defines three pairs of projections 46, 48 for engagement with the two slots 24 of each of the three edge portions.

Figure 6:
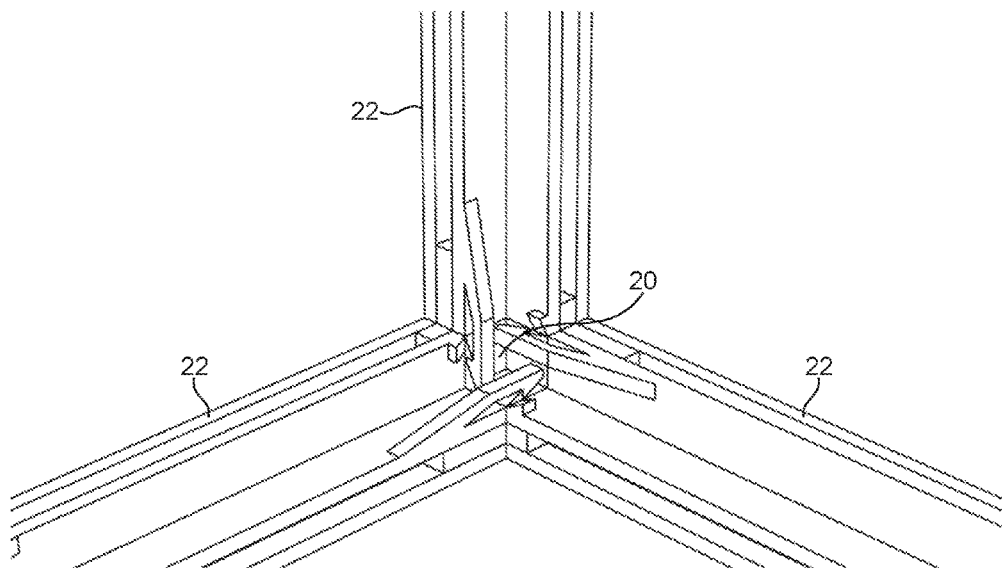
FIG. 6 is a perspective view of the components shown in FIG. 5 once they have been mutually interlocked.
Figure 8:
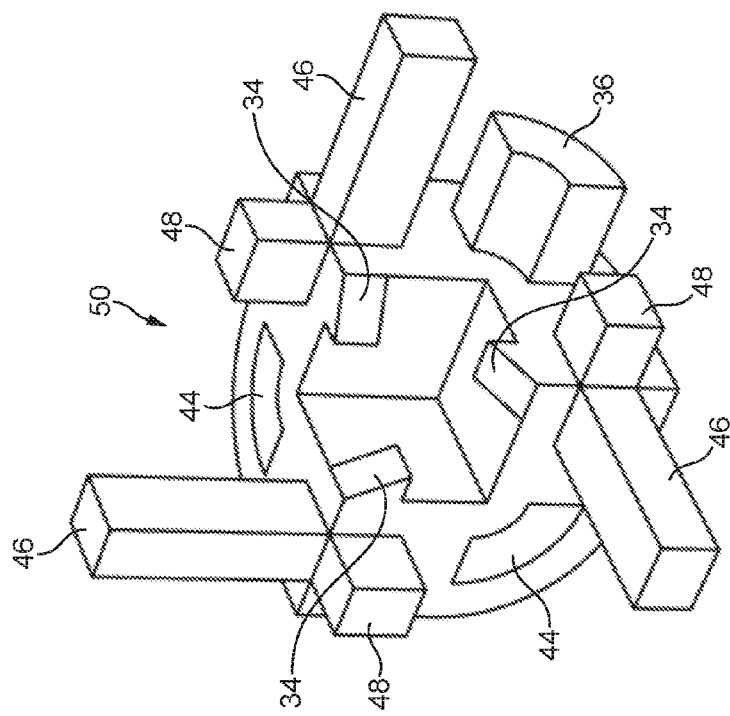
FIGS. 7 and 8 are perspective views of bottom and top corner portions, respectively.

The three edge portions and the corner portion are shown in their assembled configuration in FIG. 6.

Figure 5:
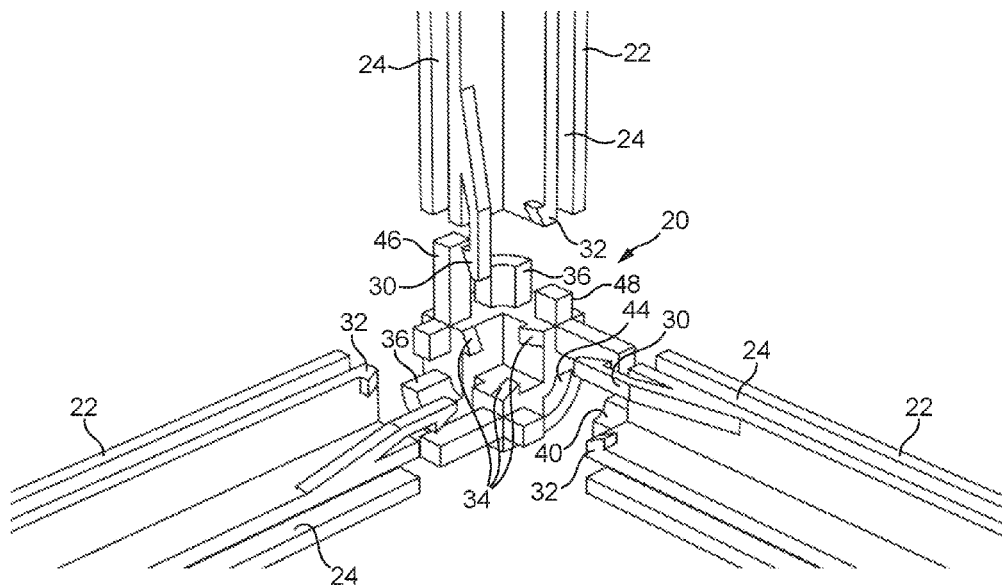
FIG. 5 is a perspective view of a corner portion and part of three edge portions spaced therefrom.

The casing corner portion configuration shown in FIG. 5 (and in the enlarged view of FIG. 7) can be employed to form four corners of one side of a casing. A modified configuration is required for the corners of the opposite side of the casing, as represented by the corner portion 50 of FIG. 8. It can be seen that the corner portion of FIG. 8 has two holes 44 where the corner portion 20 of FIG. 7 has two tabs 36, and corner portion 50 has a tab 36 where the hole 44 is located in corner portion 20.

Figure 9:
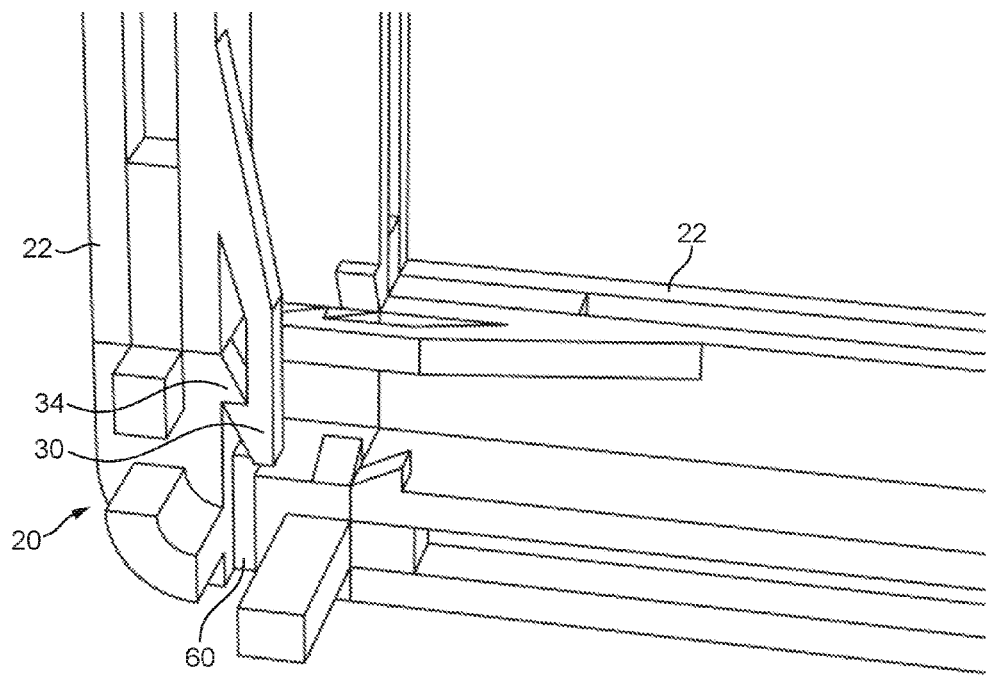
FIG. 9 is an enlarged perspective view of a corner portion interlocked with two edge portions.

In addition, corner portion 20 has a further cut-out or slot 60 to allow a tool to be inserted to release a lug locked to a detent 34 which is in line with the inner end of the slot. This slot is also visible in FIG. 9, which shows a corner portion 20 interlocked with two edge portions 22. In the assembled casing, the slot 60 forms an elongate, linear channel in combination with the adjacent edge portion, so as to guide an inserted tool into engagement with the lug to be released from the detent in line with the slot. In this way, the corner portion can be released from the edge portion, allowing the casing to be opened.

The lugs and detents are all located on inner surfaces of the corner and edge portions in the assembled casing, to provide a "clean" and visually attractive external appearance. The slot enables a user to disengage a lug from the associated detent which would otherwise be inaccessible from outside the assembled casing, thereby enabling disassembly of the casing whilst minimising the effect on the external appearance.

Figure 7:
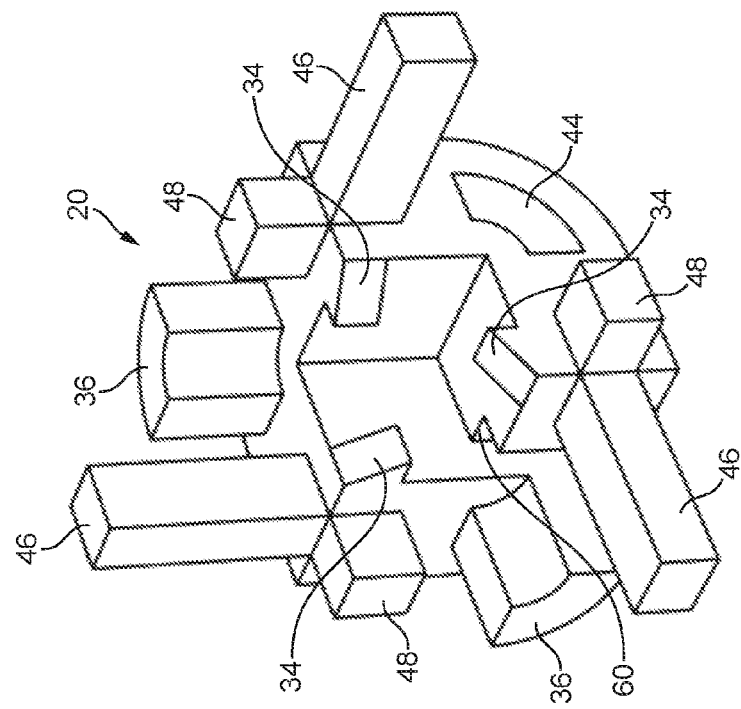

Each pair of projections 46, 48 engages with a respective edge portion. One projection 46 of each pair is longer than the other 48. The projections on the corner portion 20 of FIG. 7 are arranged such that when they are employed to form four corners of one side of a casing, each slot of each edge portion between the corners will have a longer projection 46 at one end of the slot and a shorter projection 48 at the other end. Similarly, when the corner portions 20 are combined with corner portions 50 on the other side of a casing, all the edge portion slots will have a longer projection 46 at one end of the slot and a shorter projection 48 at the other end. This can be seen in FIGS. 2A and 2B, where the two different projection lengths are visible in the slot of the horizontal edge portion 22.

This configuration was developed in combination with the casing panel formats shown in FIGS. 1 and 2 in which the panel projections 10 are offset from the corners along each edge of each panel by different distances at each end. It means that each panel can only be fully inserted into the surrounding edge portions with a specific one of its two side faces facing outwards. If the panel is orientated incorrectly, with the outer face facing inwards, one of the projections 10 will come into contact with a longer corner projection 46 before the panel has been fully installed.

Figure 10:
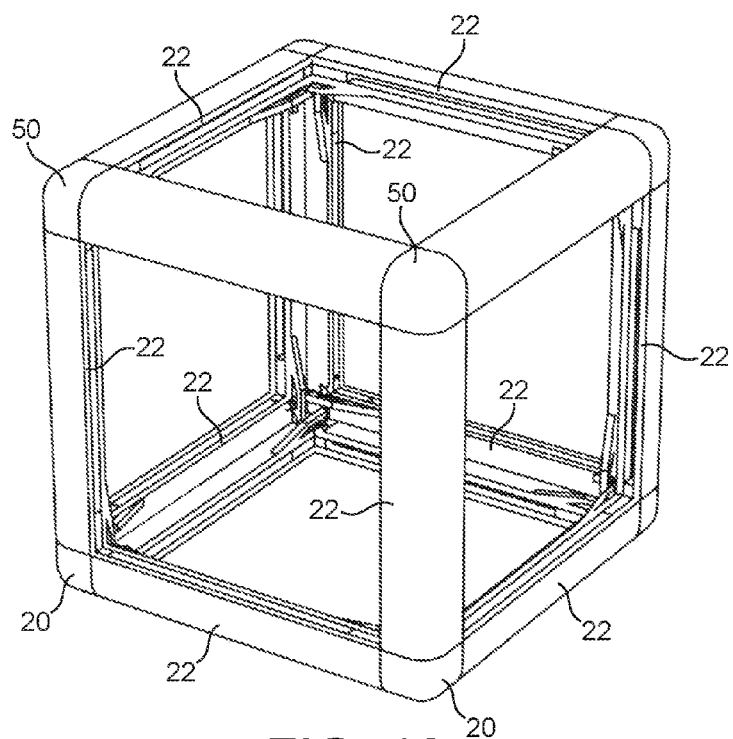
FIG. 10 is a perspective view of a casing framework of corner portions and edge portions.

FIG. 10 shows a perspective view of a casing framework formed using edge and corner portions embodying the present invention. A closed casing is formed by insertion of casing panels as described above into each side of the casing during its assembly.

It will be appreciated that different casing shapes may be formed using differing casing edge lengths.

In the embodiment of FIG. 10, twelve identical edge portions 22 are coupled together. A first set of identical corner portions 20 is provided around its base, whilst a second set of identical corner portions 50 is located around the top face of the casing.

The casing components described herein are preferably formed of plastic. More particularly, a thermoplastic such as acrylonitrile butadiene styrene (ABS) may be used, but the components could also be manufactured from many other plastics. Each component may be integrally formed as a single article. The components (or parts thereof) could also be manufactured from wood, metal or ceramic materials. Different materials (such as metal) may be used for different parts (lugs and detents, for example) of the components, where appropriate for increased strength, flexibility or resilience, for example.

Figure 11:
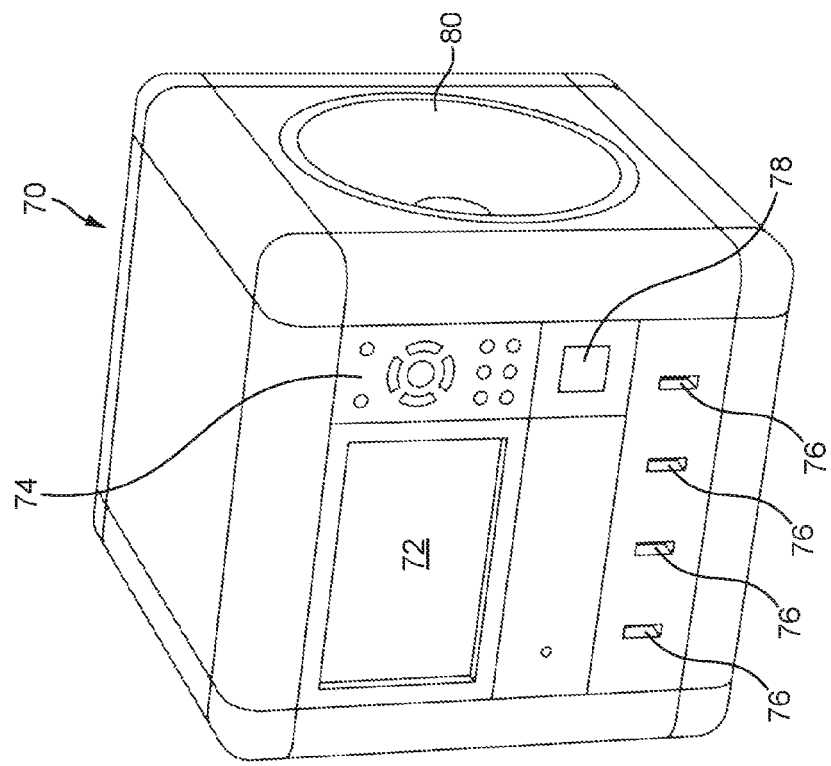

It will be appreciated that a wide range of electronic displays, interfaces, controls, sockets and so on may be incorporated into the panels of a casing embodying the present invention to suit particular requirements. For example, device 70 shown in FIGS. 11 and 12 incorporates a screen 72, key pad 74, USB sockets 76, an IR remote control receiver 78 on the front, speakers on the sides 80, and NV sockets 82 and RJ-45 network port 84 and a power connector 86 on the rear.

Figure 13:
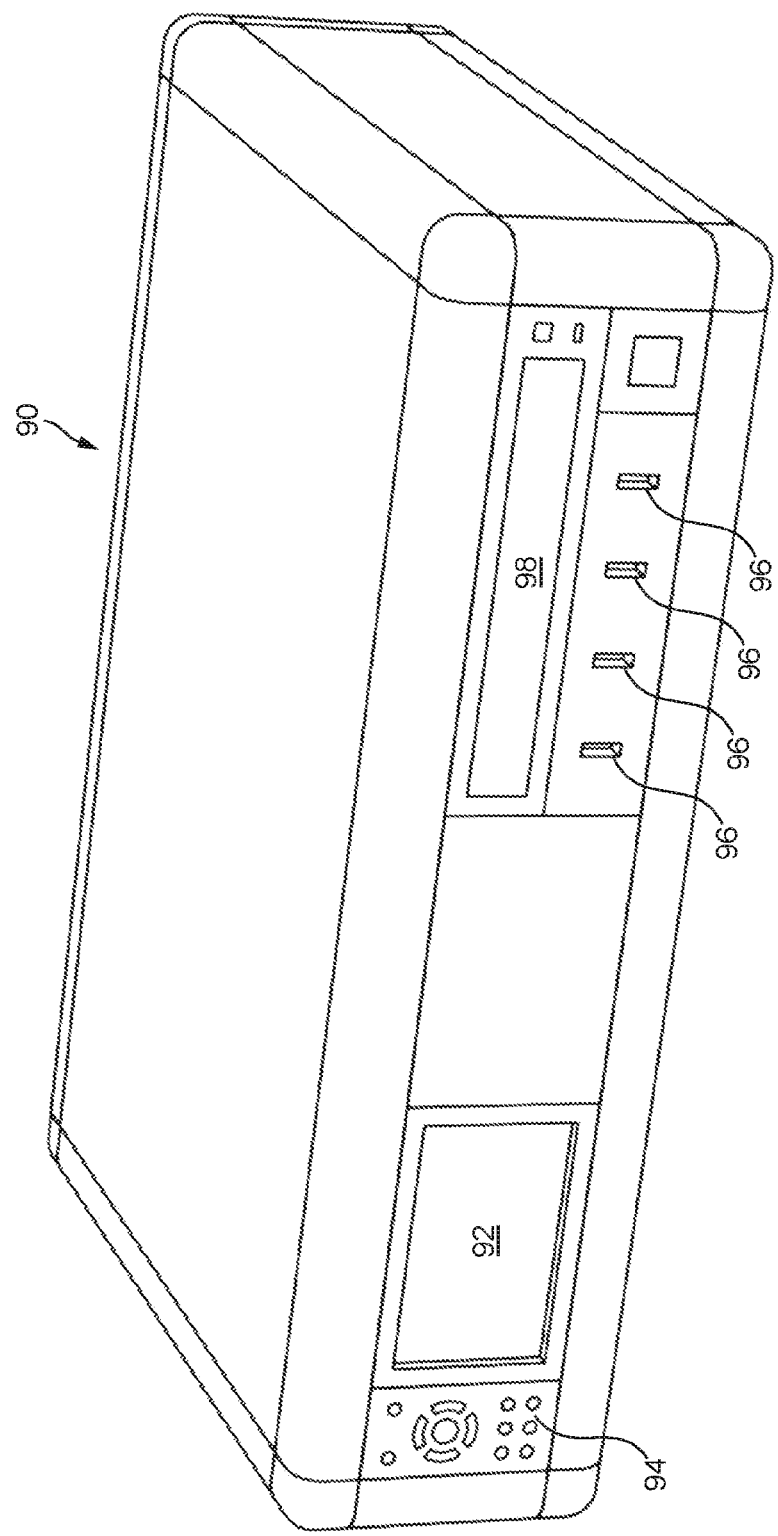
FIGS. 13 and 14 are front and rear perspective views, respectively, of a further casing configuration including a variety of casing panels.
Figure 14:
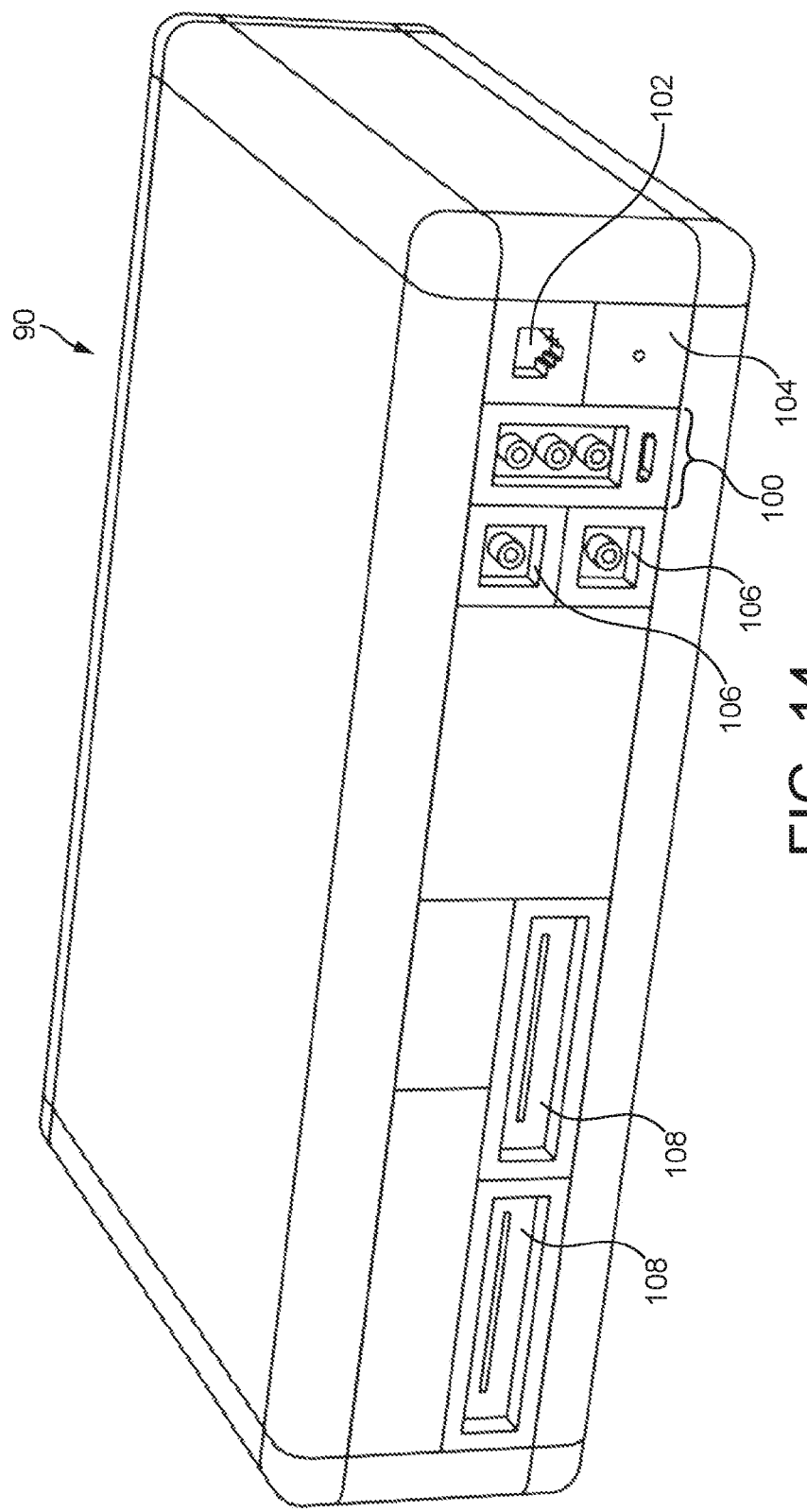

The device 90 of FIGS. 13 and 14 includes a screen 92, key pad 94, USB sockets 96 and a retractable video disc holder 98 on the front. As shown in the rear view of FIG. 14, NV sockets 100, an RJ-45 network port 102, a power connector 104, two RF connectors 106 and two conditional access modules (CAMs) 108 are provided at the rear.

Figure 12:
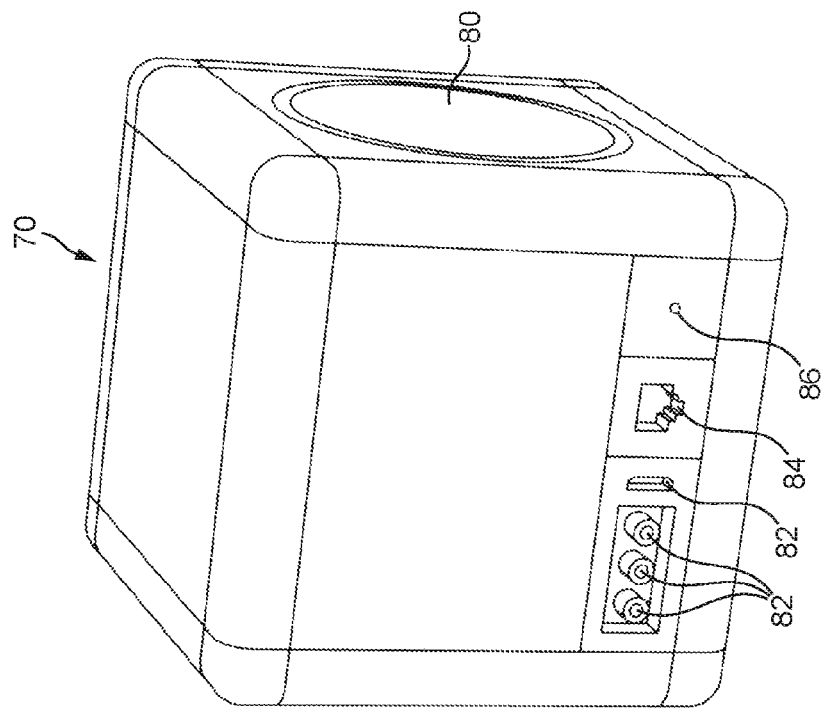
FIGS. 11 and 12 are front and rear perspective views, respectively, of a casing including a variety of different casing panels.

In comparison to the rear of the device of FIG. 12, it can be seen in FIG. 14 that the same casing panels have been rearranged in a different configuration, including rotation of the panel supporting the A/V sockets. This illustrates the versatility of the casing panels arising from their modular format and rotational symmetry.

Similarly, the internal configuration of an electronic device including a casing embodying the present invention can be selected to suit particular requirements. The buses and interconnects used may use industry-standard configurations, for example.

Figure 16:
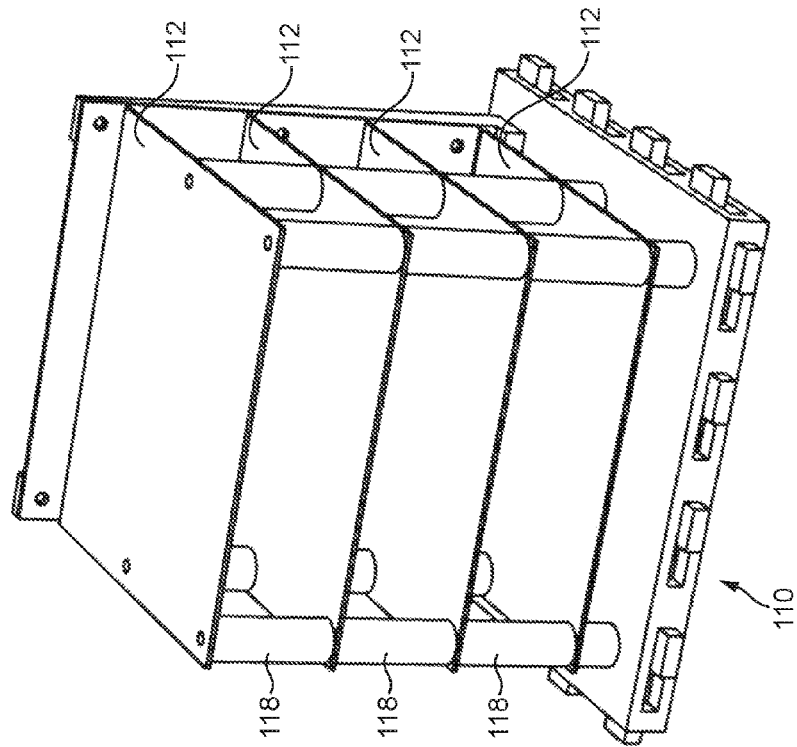
FIG. 16 is a perspective view of the casing panel of FIG. 11 with four processing boards mounted thereon.
Figure 15:
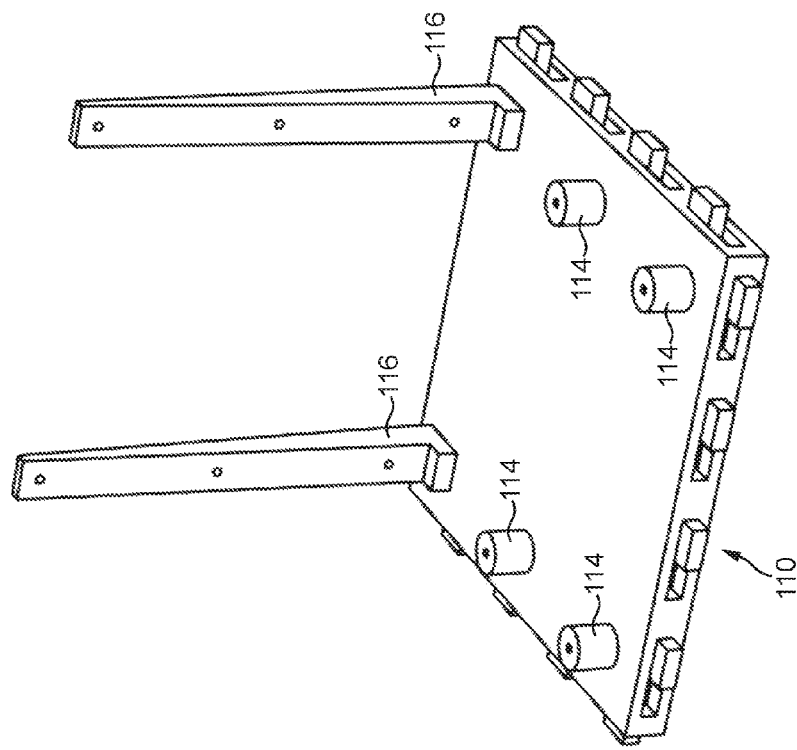
FIG. 15 is a perspective view of a casing panel for receiving one or more processing boards.

FIGS. 15 and 16 show one embodiment of a casing panel adapted to support multiple processor boards 112.

As can be seen in FIG. 15, a set of two cylindrical pillars 114 and a support column 116 is provided adjacent to each of two opposite edges of the internal face of the casing panel 110. As shown in FIG. 16, they can be employed to support a number of processor boards 112 together with spacer pillars 118 which extend vertically between adjacent boards.

Figure 17:
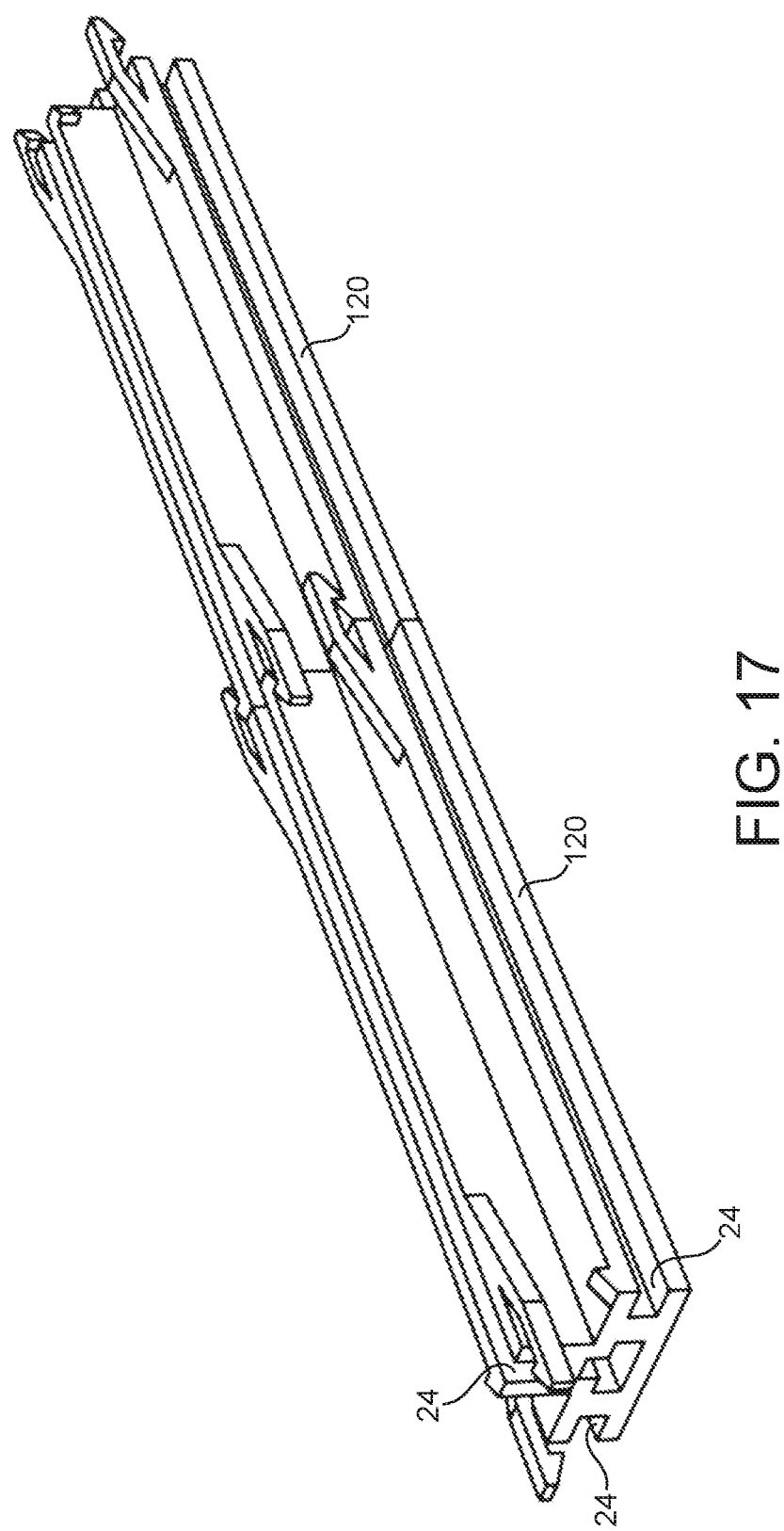
FIGS. 17 to 19 are perspective views of three pairs of interconnected edge portions of different configurations.
Figure 18:
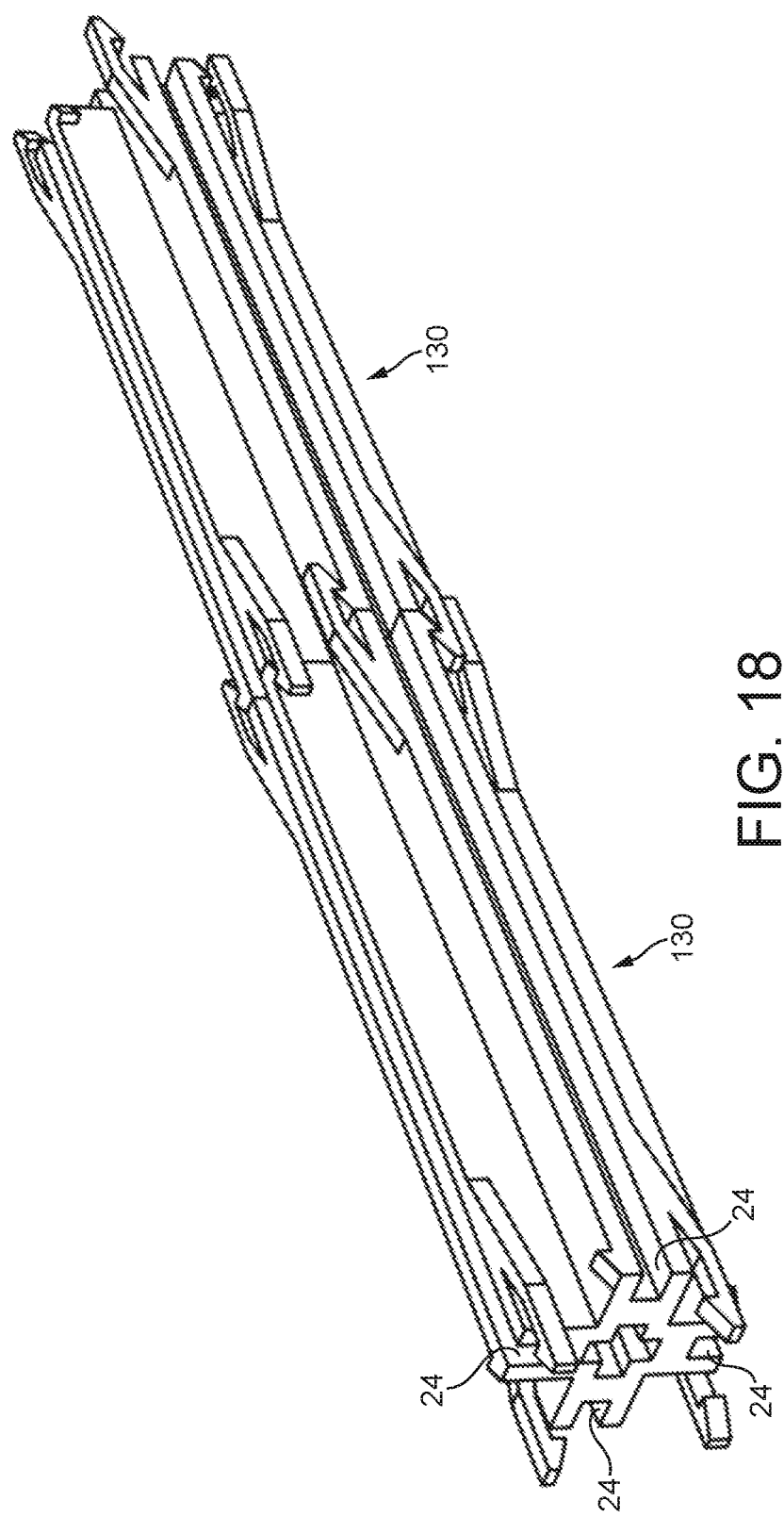
Figure 19:
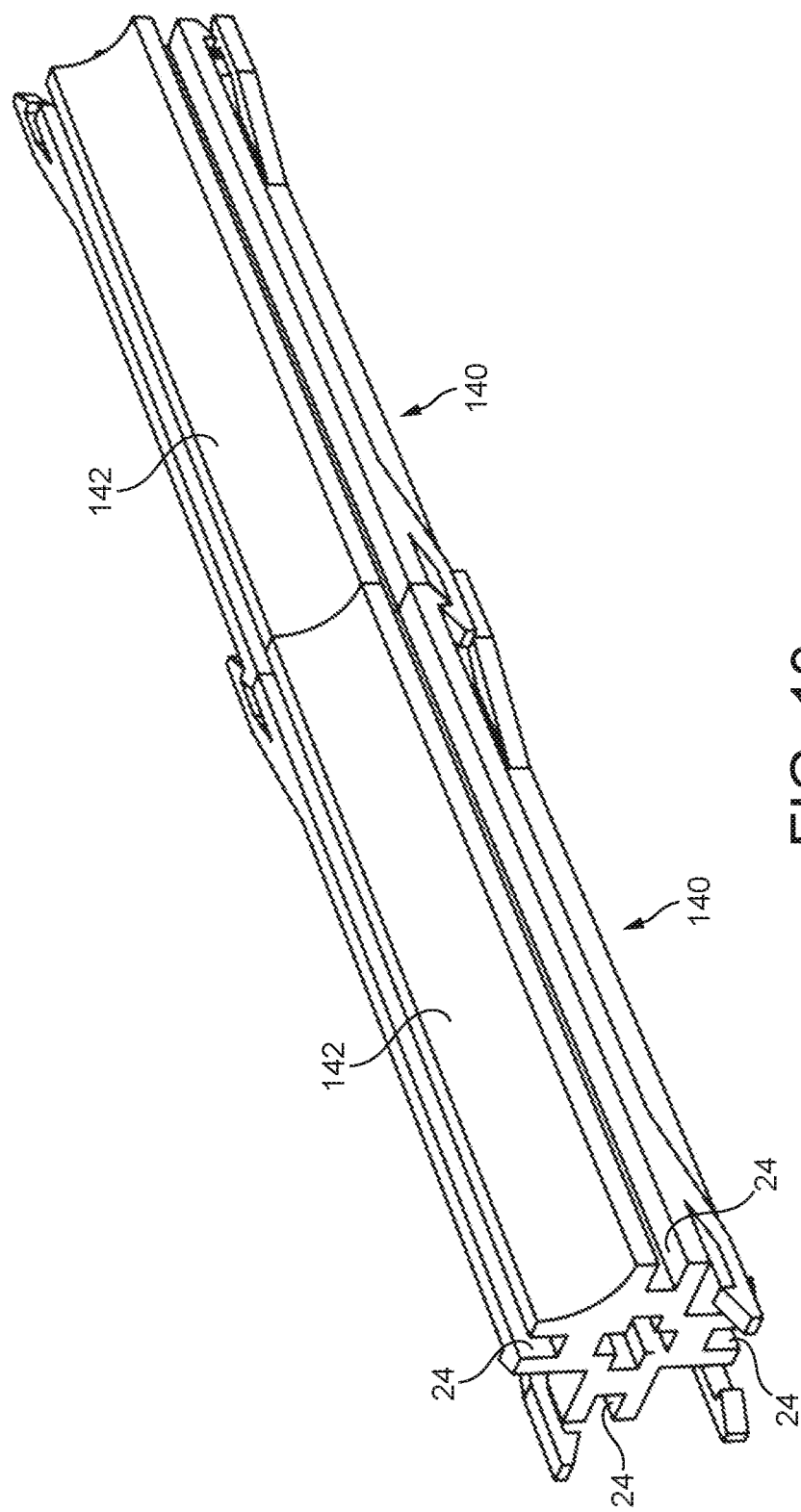

FIGS. 17 to 19 illustrate a number of different edge portion configurations for use in embodiments of the present invention. The interlocked edge portions 120 of the pair shown in FIG. 17 are arranged to engage with three orthogonally arranged casing panels using three slots 24. The edge portions 130 shown in FIG. 18 are configured to engage with four mutually orthogonal casing panels using slots 24, as is the case with the edge portions 140 of FIG. 19. Edge portions 140 of FIG. 19 differ from edge portions 130 of FIG. 18 in that a smooth curved surface 142 is defined by each edge portion between two adjacent slots 24. This enables the casing to present a smooth external surface at this location.

Further corner portion configurations for use in casings embodying the present invention are illustrated in FIGS. 20 to 25.

Figure 21:
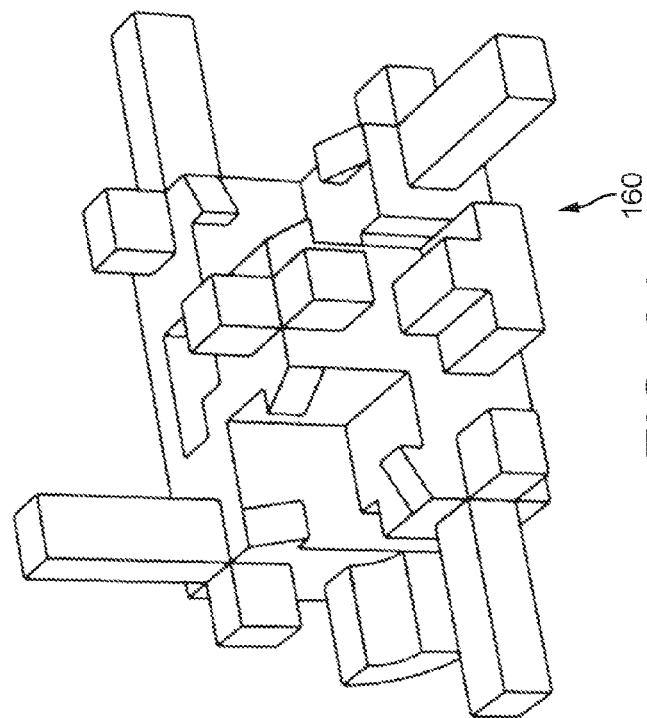
FIGS. 20 to 25 show corner portions of different configurations according to embodiments of the present invention.
Figure 20:
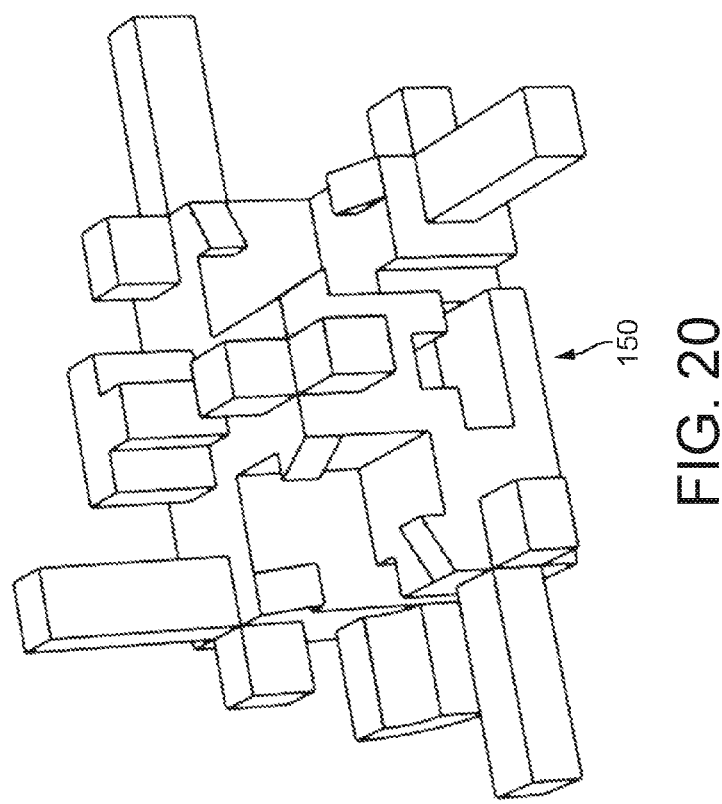

Corner portions 150 and 160 of FIGS. 20 and 21 are arranged to engage with four orthogonally arranged edge portions. They therefore facilitate interconnection of four edge portions midway along a casing edge. As with the corner portions of FIGS. 8 and 9, two slightly different configurations are provided for use on different sides of the casing.

Figure 23:
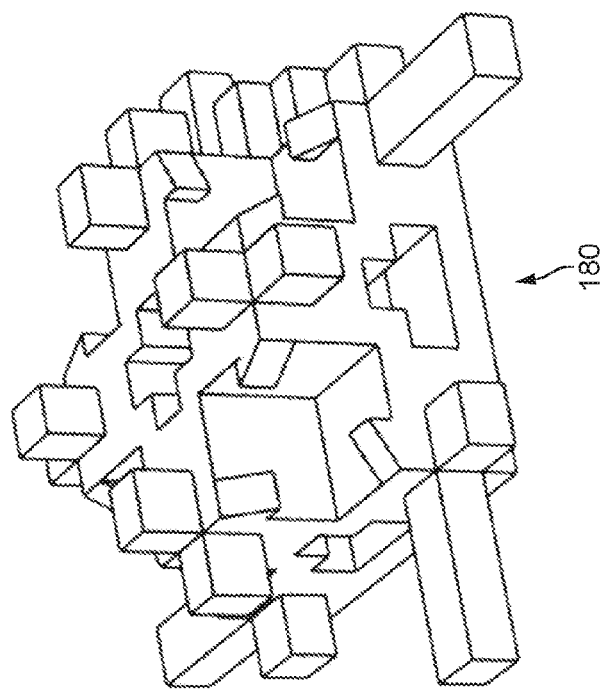
Figure 22:
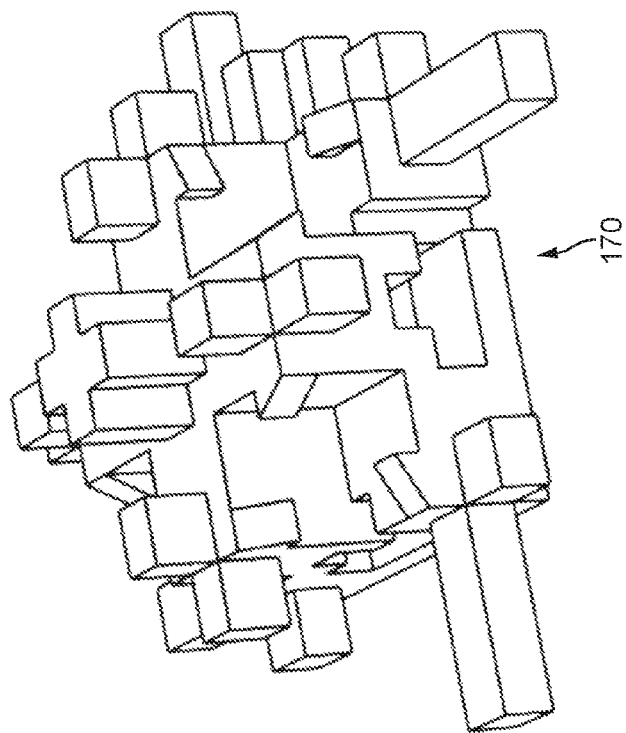

FIGS. 22 and 23 show a corner portion configuration suitable for engagement with five orthogonally arranged edge portions. It is arranged to interconnect with four edge portions lying in a common plane and a fifth edge portion perpendicular to that plane. This fifth edge portion may have the configuration shown in FIG. 18. This form of corner portion is suitable for location at an intermediate point in a side of a casing. Again, two slightly different configurations are provided for use on different sides of the casing.

Figure 24:
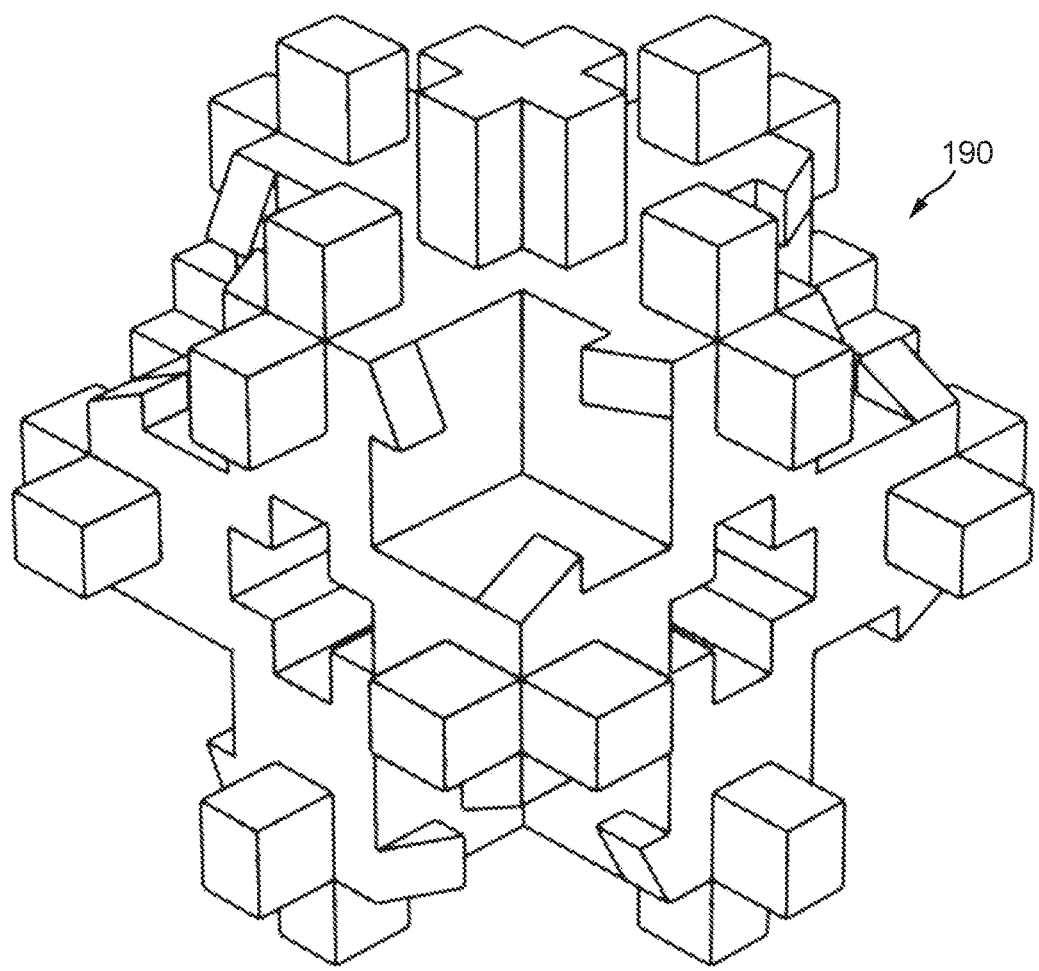

FIG. 24 illustrates a six-way centre connector for engagement with six mutually orthogonal edge portions. It is therefore suitable for location at an internal intersection of six edge portions in the casing.

Figure 25:
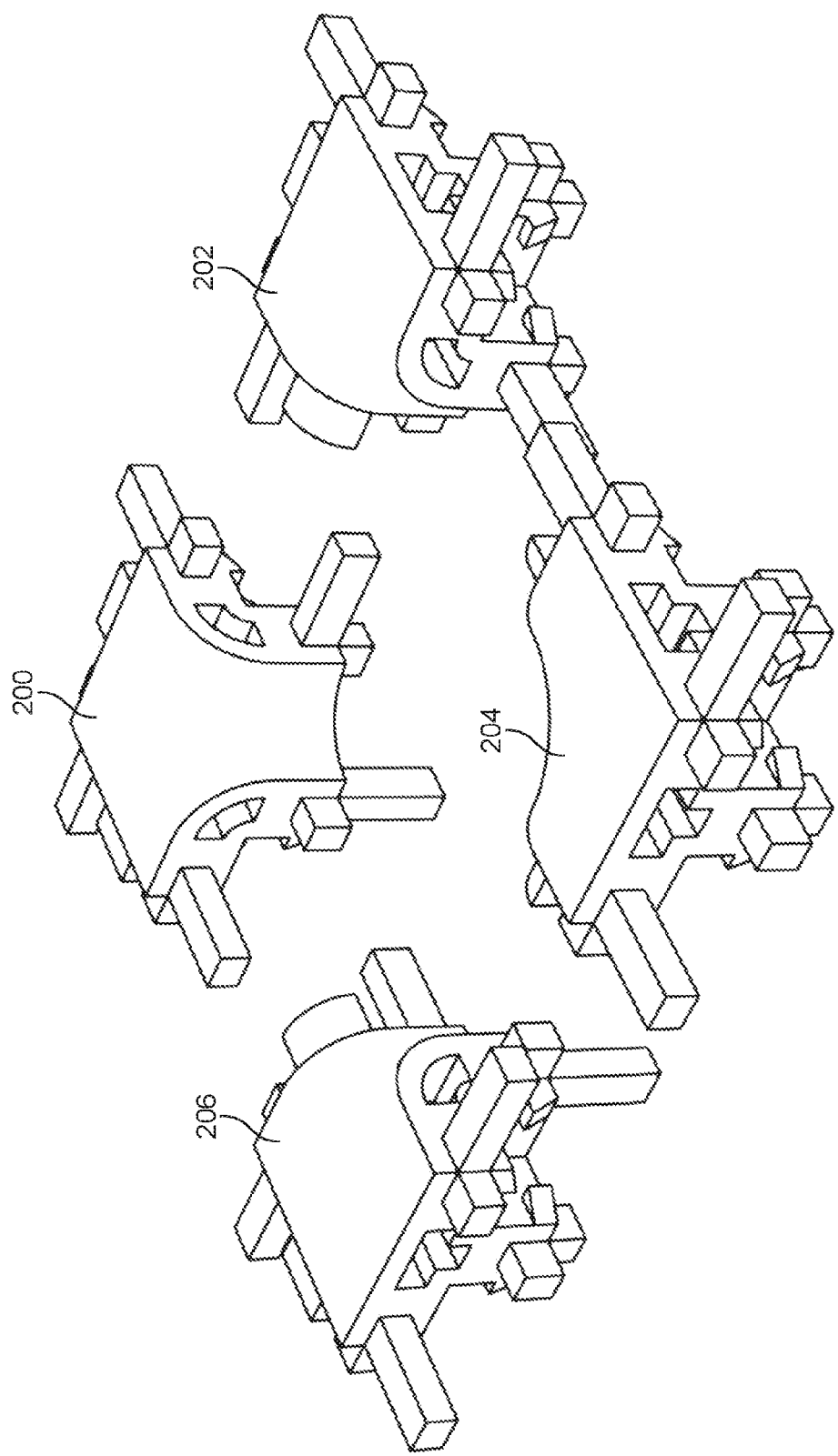

FIG. 25 illustrates a set of four corner portions 200, 202, 204 and 206. Each is configured to interengage with five orthogonally orientated edge portions. Each corner portion is therefore able to define an internal angle in the casing.

Figure 26:
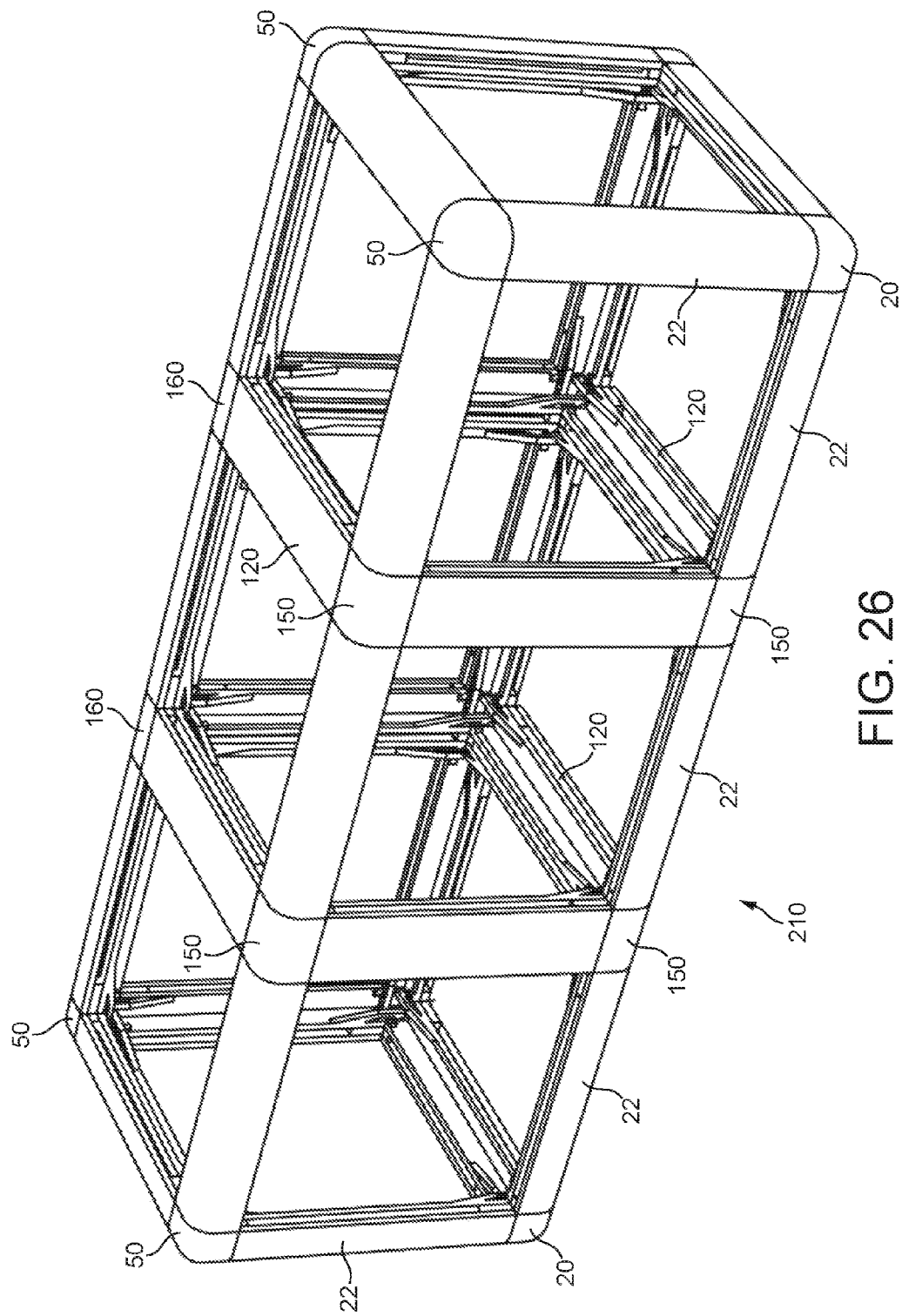
FIGS. 26 to 30 are perspective views of different casing frameworks for use in embodiments of the present invention.
Figure 27:
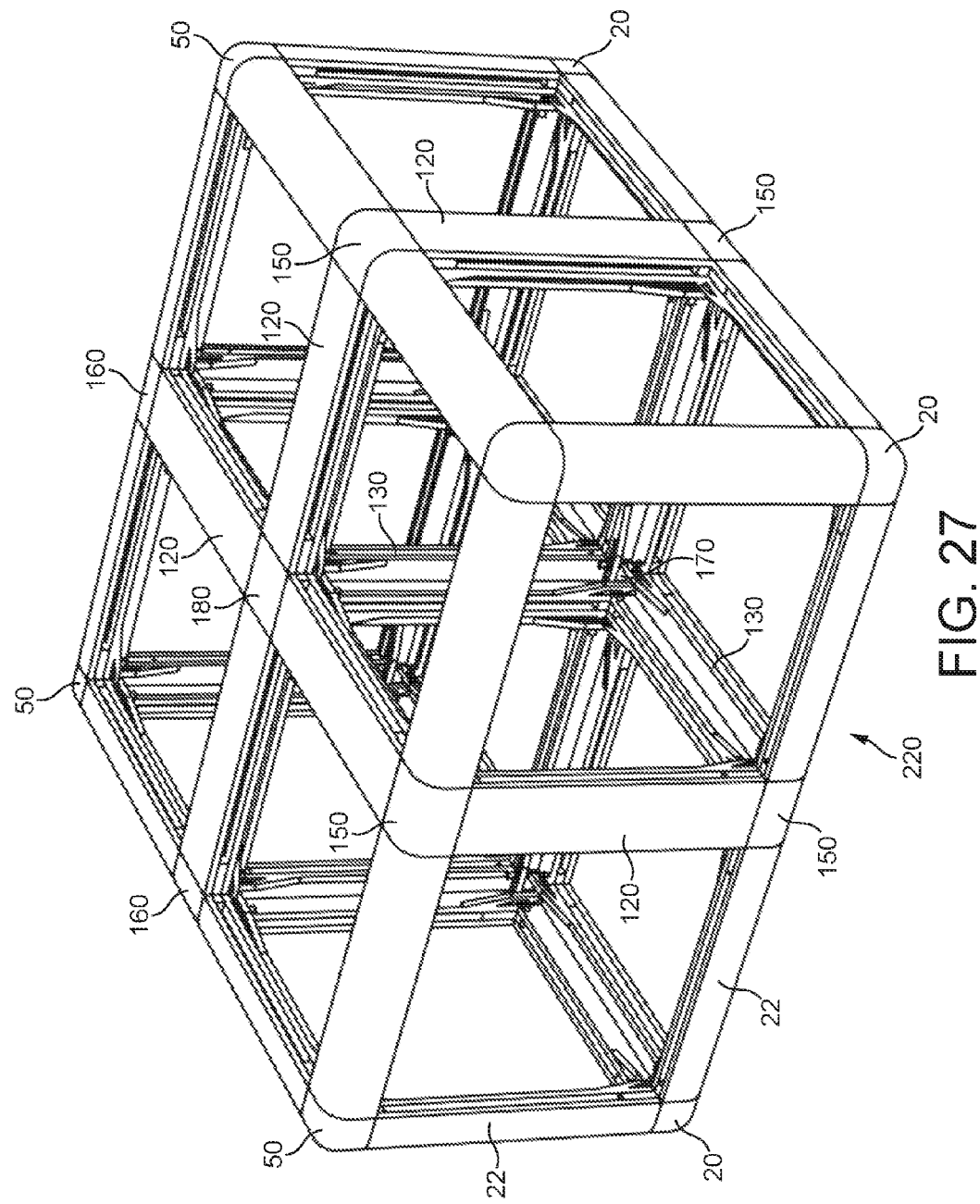
Figure 28:
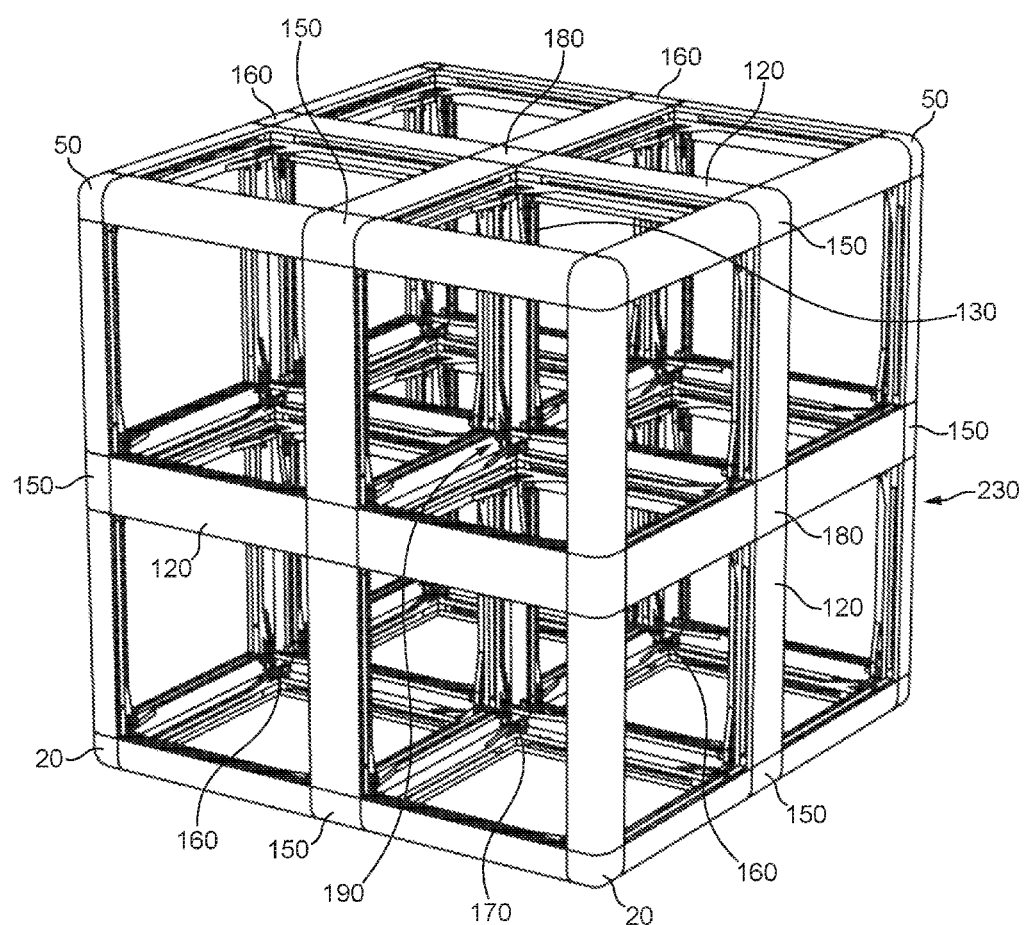

FIGS. 26 to 30 illustrate examples of casing frameworks that may be constructed according to embodiments of the present invention using corner portions and edge portions of the form described herein. FIGS. 26, 27 and 28 show configurations which extend a casing having a single edge portion in each side in one, two and three mutually perpendicular directions.

Figure 29:
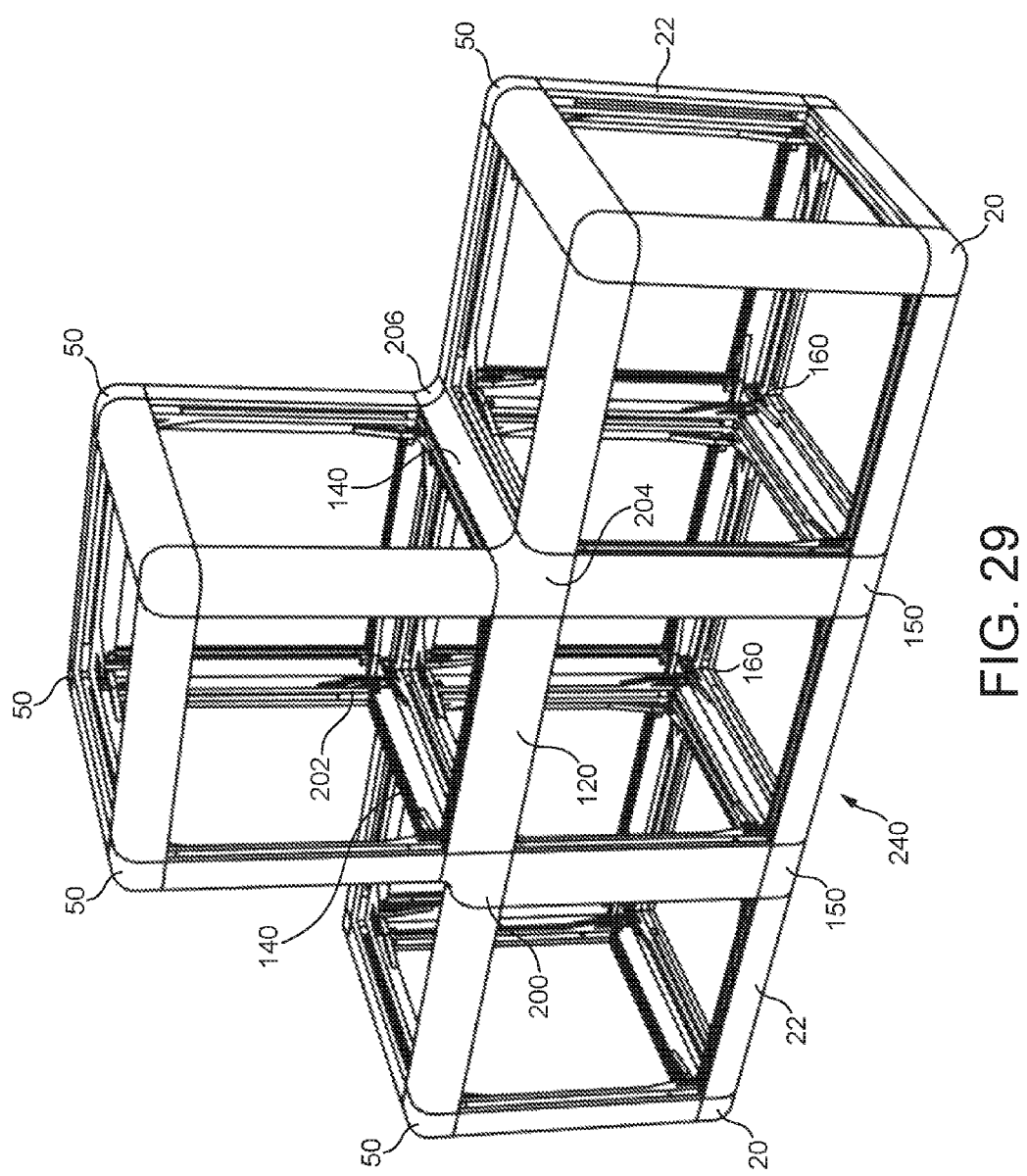
Figure 30:
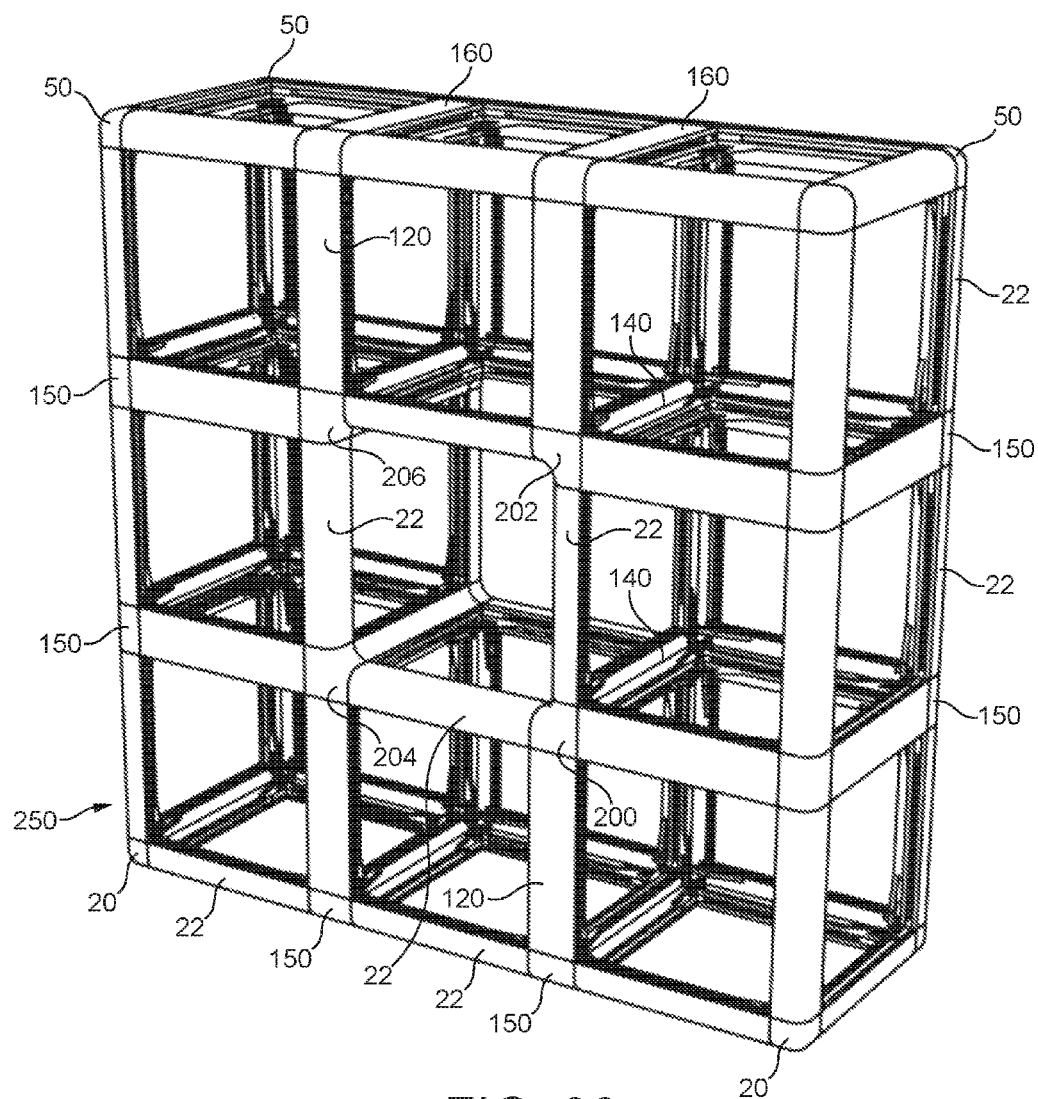

FIGS. 29 and 30 illustrate examples of how inner corner portions of the form shown in FIG. 25 can be employed to increase the variety of casing configurations achievable according to the present invention.

Other forms of interlocking may be used to connect corner and edge portions (and edge portions to edge portions) in a casing embodying the present invention. For example, the detents may be resiliently mounted instead of, or as well as, the corresponding projections. Also, other forms of snap-fitting interlocking arrangements may be employed instead of those shown in the embodiments of the drawings.

While the present invention has been illustrated by description of various embodiments and while those embodiments have been described in considerable detail, it is not the intention of Applicant to restrict or in any way limit the scope of the appended claims to such details. Additional advantages and modifications will readily appear to those skilled in the art. The present invention in its broader aspects is therefore not limited to the specific details and illustrative examples shown and described. Accordingly, departures may be made from such details without departing from the spirit or scope of Applicant's invention.

What is claimed is:

1. An electronics modular casing comprising edge portions and corner portions, with each corner portion interlocked with adjacent edge portions to form a framework, and panels which are retained by engagement with edge portions, wherein each edge of at least one panel has a projection extending from the edge and a cavity defined in the edge for interengagement with a cavity and a projection, respectively, of an adjacent panel, an arrangement of projections and cavities around the edges of the at least one panel is rotationally symmetrical about an axis perpendicular to a plane of the panel, and a shape of the at least one panel is a multiple of a square having sides of a unit length, with each unit length along each side of the at least one panel comprising a projection extending from the edge and a cavity defined in the edge for interengagement with a cavity and a projection, respectively, of an adjacent panel.

2. A casing of claim 1, wherein the framework includes at least two mutually interlocked edge portions, one edge portion includes a first lug and the other edge portion includes a first detent which engages with the first lug when the two portions are pushed together, and the other edge portion includes a second lug and the one edge portion includes a second detent which engages with the second lug when the two portions are pushed together.

3. A casing of claim 2, wherein one edge portion includes a tab projecting from one end which is received in a corresponding hole in one end of the other edge portion.

4. A casing of claim 3, wherein the tab is curved in transverse cross-section.

5. A casing of claim 1, wherein at least one corner portion defines a slot adjacent to a detent, such that a lug engaged with the detent may be disengaged from the detent by a user accessing the detent from outside the casing via the slot.

6. A casing of claim 5, wherein each corner portion is interengaged with each of the edge portions by a pair of projections, with each projection being received in a respective slot in the corresponding edge portion, and one projection of each pair being longer than the other.

7. A casing of claim 1, wherein at least one corner portion is interlocked with three, four, five or six mutually orthogonal edge portions.

8. A casing of claim 1, wherein a slot is defined in at least one edge portion for sliding engagement with a projection on an adjacent panel.

9. A casing of claim 1, wherein at least one edge portion is arranged to engage with two, three or four mutually orthogonal panels.

10. A casing of claim 1, wherein each corner portion is interengaged with adjacent edge portions by tabs and complementary holes on the corner portion and edge portions.

11. A casing of claim 1, wherein each of the edge portions is substantially identical.

12. A kit of parts for forming an electronics modular casing of claim 1, comprising edge portions and corner portions, with each corner portion configured to interlock with edge portions to form a framework, and panels which are configured so as to be retained by engagement with edge portions.

13. A non-transitory computer-readable medium storing computer-executable instructions adapted to cause a 3D printer to print a casing of claim 1.

* * * * *